US007283390B2

(12) United States Patent
Pesavento

(10) Patent No.: US 7,283,390 B2

(45) Date of Patent: Oct. 16, 2007

(54) HYBRID NON-VOLATILE MEMORY

(75) Inventor: Alberto Pesavento, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 11/237,099

(22) Filed: Sep. 28, 2005

(65) Prior Publication Data

US 2006/0023550 A1 Feb. 2, 2006

Related U.S. Application Data

(63) Continuation-in-part of application No. 11/016,546, filed on Dec. 17, 2004, and a continuation-in-part of application No. 11/015,293, filed on Dec. 17, 2004, and a continuation-in-part of application No. 11/839, 935, filed on May 5, 2004, and a continuation-in-part of application No. 10/830,280, filed on Apr. 21, 2004, now Pat. No. 7,212,446.

(51) Int. Cl.
*G11C 11/34* (2006.01)

(52) U.S. Cl. .......................... 365/185.01; 365/185.28; 365/185.33

(58) Field of Classification Search ........... 365/185.01, 365/185.28, 96, 185.33; 711/103, 170
See application file for complete search history.

(56) References Cited

U.S. PATENT DOCUMENTS 7,106,642 B2 * 9/2006 Hojo .......................... 365/200
2005/0251617 A1 * 11/2005 Sinclair et al. ............. 711/103

* cited by examiner

*Primary Examiner*—Richard T. Elms
*Assistant Examiner*—Dang Nguyen
(74) *Attorney, Agent, or Firm*—Merchant & Gould; Carl K. Turk

(57) ABSTRACT

A non-volatile memory (NVM) circuit includes at least two types of NVM sub-circuits that share common support circuitry. Different types of NVM sub-circuits include ordinary NVM circuits that provide a logic output upon being addressed, programmable fuses that provide an output upon transitioning to a power-on state, NVM circuits that provide an ON/OFF state output, and the like. Some of the outputs are used to calibrate circuits within a device following power-on. Other outputs are used to store information to be employed by various circuits.

33 Claims, 11 Drawing Sheets

DEVICE WITH HYBRID NVM
(2 TYPES OF NVM)

*DEVICE WITH PROGRAMMABLE FUSES AND ORDINARY NVM*

DEVICE WITH HYBRID NVM

*DEVICE WITH HYBRID NVM*
*(2 TYPES OF NVM)*

*DEVICE WITH HYBRID NVM (3 TYPES OF NVM)*

HYBRID NVM WITH HIGH VOLTAGE SWITCHES

*HYBRID NVM WITH CLOOP*

*TYPE OF NVM CELL:*

*"ORDINARY" (PROVIDES LOGIC OUTPUT)*

TYPE OF NVM CELL:

"PROGRAMMABLE FUSE"

*TYPE OF NVM CELL:*

*(SUITABLE FOR TRIMMING ANALOG CIRCUIT)*

*TYPE OF NVM CELL:*

*(PROVIDES ON / OFF STATES)*

HYBRID NON-VOLATILE MEMORY

RELATED APPLICATIONS

This utility patent application is a continuation-in-part (CIP) of U.S. patent application Ser. No. 10/830,280 filed on Apr. 21, 2004 now U.S. Pat. No. 7,212,446; Ser. No. 11/839,935 filed on May 5, 2004; Ser. No. 11/016,546 filed on Dec. 17, 2004; and Ser. No. 11/015,293 filed on Dec. 17, 2004. The benefit of the earlier filing date of the parent applications is hereby claimed under 35 U.S.C. §120.

Furthermore, this application may be found to be related to U.S. Pat. Ser. No. 6,853,583 and U.S. patent application Ser. No. 10/813,907 filed on Mar. 30, 2004; Ser. No. 10/814,866 filed on Mar. 30, 2004; and Ser. No. 10/814,868 filed on Mar. 30, 2004.

This application may also be found related to U.S. Patent Application titled "RFID TAG USING HYBRID NON-VOLATILE MEMORY", by inventor Alberto Pesavento, filed with the USPTO on the same day as the present application, and due to be assigned to the same assignee Ser. No. 11/237,012.

The referenced Patent and Patent Applications, as well as the parent Patent Applications are incorporated herein by reference.

TECHNICAL FIELD

The present invention relates to Non-Volatile Memory (NVM) circuits and devices; and more particularly, to hybrid NVM devices that include multiple types of NVM circuits supported by common support circuitry.

BACKGROUND

Memory devices are electronic devices arranged to store electrical signals. For example, a basic memory element may be a fuse that can either be open or be closed. Open and closed states of the fuse may be used to designate one bit of information corresponding to a value of 1 or 0. A plurality of memory elements can be combined in various arrangements in order to store multiple bits arranged in words or other combinations. Various electronic circuits including semiconductor devices such as transistors are used as memory elements.

Memory elements may be classified in two main categories: volatile and nonvolatile. Volatile memory loses any data as soon as the system is turned off. Thus, it requires constant power to remain viable. Most types of random access memory (RAM) fall into this category. Non-volatile memory does not lose its data when the system or device is turned off. An NVM device may be implemented as a MOS transistor that has a source, a drain, an access or a control gate, and a floating gate. It is structurally different from a standard MOSFET in its floating gate, which is electrically isolated, or "floating".

A range of considerations including a purpose of the device, power consumption, size, retention capacity and duration may influence design of non-volatile memory devices. For example, some NVM devices may be categorized as floating gate or charge-trapping from a programming perspective.

In floating gate memory circuits, electrons are typically transferred from the floating gate to the substrate or from the substrate to the floating gate by bi-directional tunneling through a thin silicon dioxide ($SiO_2$) layer. Tunneling is the process by which an NVM device can be either erased or programmed and is usually dominant in thin oxides of thicknesses less than 12 nm. Storage of the charge on the floating gate allows the threshold voltage to be electrically altered between a low and a high value to represent logic 0 and 1, respectively. Other types of electron injection methods such as hot electron injection may also be employed in floating gate devices. In floating gate memory devices, charge or data is stored in the floating gate and is retained when the power is removed.

In charge-trapping memory devices, charge or data is stored in the discrete nitride traps and is also retained when the power is removed. Charge-trapping devices are typically used in MNOS (Metal Nitride Oxide Silicon), SNOS (Silicon Nitride Oxide Semiconductor), and SONOS (Silicon Oxide Nitride Oxide Semiconductor) technologies. The charges in MNOS memories may be injected from the channel region into the nitride by quantum mechanical tunneling through an ultra-thin oxide (UTO).

Non-volatile memory devices may also be implemented as NVM arrays that include a plurality of NVM cells arranged in rows and columns. In general, single-transistor n-channel NVM cells operate as follows. During an erase operation, electrons are removed from a floating gate of the NVM cell, thereby lowering the threshold voltage of the NVM cell. During a program operation, electrons are inserted into the floating gate of the NVM cell, thereby raising the threshold voltage of the NVM cell. Thus, during program and erase operations, the threshold voltages of selected NVM cells are changed. During a read operation, read voltages are applied to selected NVM cells. In response, read currents flow through these selected NVM cells.

SUMMARY

Aspects of the invention are directed to a hybrid NVM circuit that includes a plurality of NVM sub-circuits of different types. The NVM sub-circuits, which can store data in a way that survives loss of power, may differ in their structure and/or function, but share common support circuitry.

According to one example aspect, one NVM sub-circuit is structured to provide its stored data during a transition period from a power-off state to a power-on state. Another NVM sub-circuit of the same NVM may provide its stored data upon being addressed in the power-on state.

According to another aspect, a first NVM sub-circuit may be adapted to provide a logic output to an operational component, while a second NVM sub-circuit provide an ON/OFF state output to another operational component.

In each aspect two or more NVM sub-circuits of the hybrid NVM circuit share at least a portion of the support circuitry.

It will be appreciated that a hybrid NVM circuit according to aspects may include any number of NVM sub-circuits of different types. The NVM sub-circuits may be of any type and share a portion or the whole support circuitry.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1A:
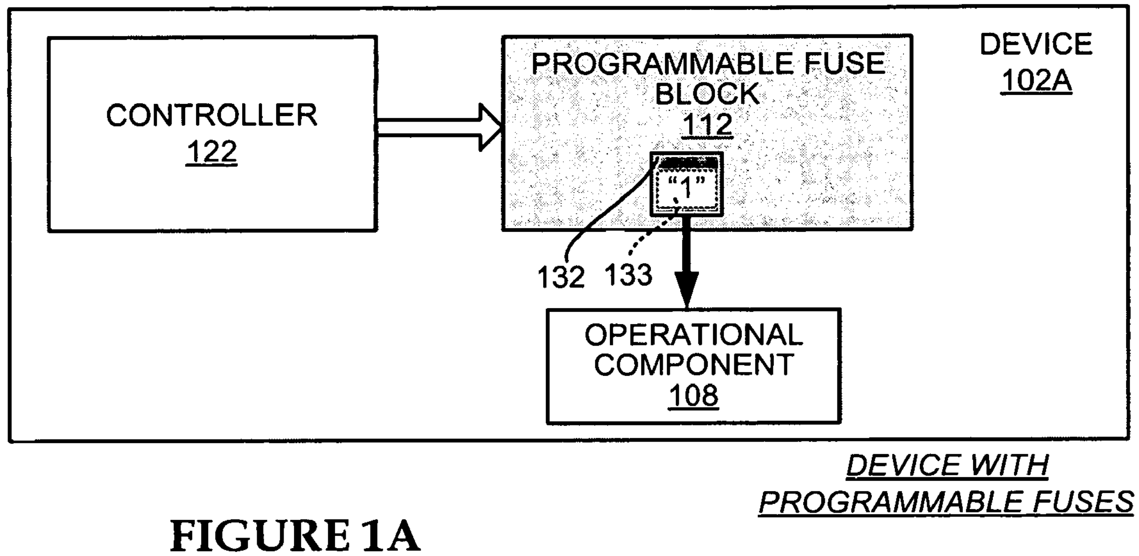
FIG. 1A is a block diagram of a device that includes a programmable fuse block for storing data such as calibration data to be used by an operational component.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity. The term "ordinary NVM" refers to an NVM circuit or device that stores and outputs a logic value to be used by an operational component. As such, the "ordinary NVM" may or may not be arranged to provide the logic value for special purposes such as trimming an analog circuit.

FIG. 1A is a block diagram of device 102A that includes a programmable fuse block for storing data such as calibration data to be used by an operational component.

Device 102A includes programmable fuse block 112, operational component 108, and controller 122. Device 102A may be any electronic device that uses a memory circuit, in particular, a non-volatile memory circuit. Device 102A may use a variety of NVM circuits depending on available power, size, use of the stored information, and the like. For example, device 102A may be a Radio Frequency IDentification (RFID) tag with limitations on available power and size that uses an output of its NVM circuit to calibrate certain operational components, and the like.

A programmable fuse is essentially a non-volatile memory because it retains stored information in a power off state. A programmable fuse may be one time programmable (OTP) or multiple times programmable (MTP). Programmable fuse block 112 shown in the figure may include one or more programmable fuses. In case of multiple fuses, programmable fuse block 112 may include fuses that are arranged in an array.

Programmable fuse block 112 may provide an output to operational component 108 immediately following a transition to power-on state, while other types of NVM circuits may need to be addressed prior to providing their output. Accordingly, programmable fuse block 112 provides a fast NVM circuit that may be employed to calibrate operational components of a device during a power-on mode.

Device 102A also includes an operational component 108. As will be seen later in this description, operational component 108 is intended to be any one or more of a large possible number of components of device 102A, including programmable fuse block 112 itself, or even a component external to device 102A.

Operational component 108 may operate based on configuration/calibration data. A number of ways for accomplishing this are described later in this document. A distinction should be kept in mind, however, that programmable fuse block 112 may be employed to store other types of data in addition to the calibration data, such as a serial number of the RFID tag.

Programmable fuse block can store data 133 in cell 132. Data 133 encodes at least one value, or a series of values, for one or more operational components such as operational component 108. Data 133 may be the calibration data for operational component 108. Cell 132 may be a programmable fuse, a group of fuses, and the like. Data 133 encodes at least one value, or a series of values, for one or more operational components such as operational component 108. In some embodiments, data 133 is at least one logical bit, such as a 1 or a zero, stored in cell 132.

Data 133 may be input in operational component 108 via any number of paths. As data 133 is moved, it may change nature, or what it encodes.

Device 102A moreover includes controller 122. Controller 122 is adapted to program data 133 in cell 132. In addition, controller 122 may cooperate with other components, such as operational component 108.

As written above, operational component 108 may be any one or more of any of the tag circuit components. If more than one, then a plurality of calibration data may be stored. For each one of the possible operational components, one or more of their operation or performance characteristics may be controlled and/or changed by the calibration data. A number of examples and manners of controlling are described in this document.

Figure 1B:
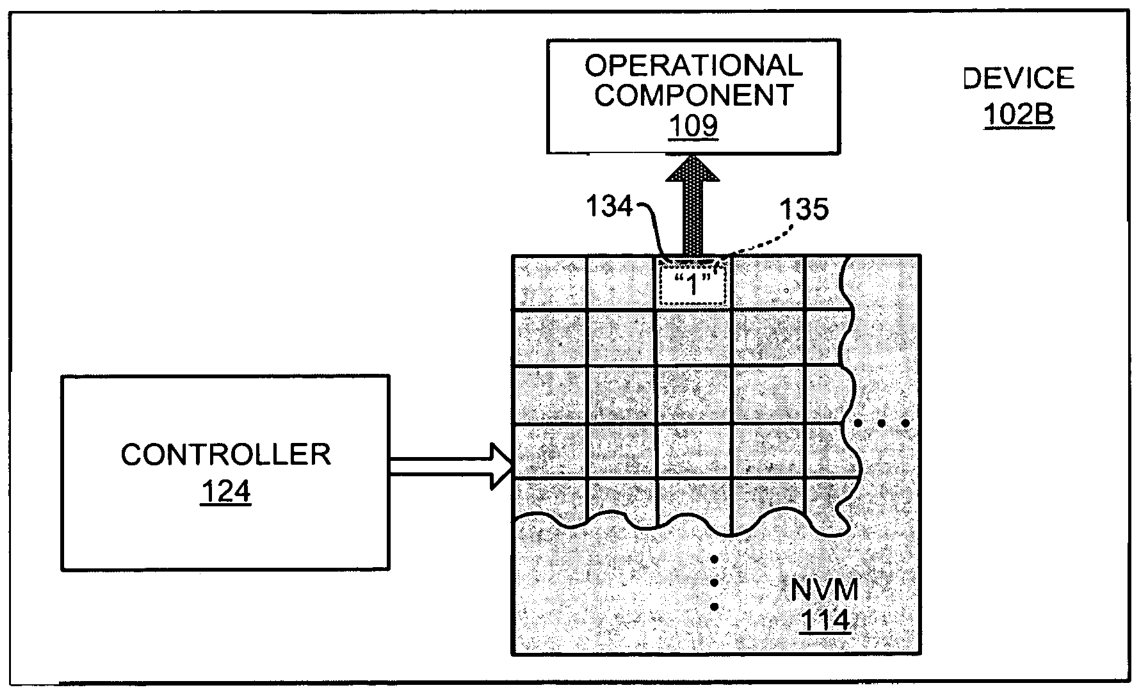
FIG. 1B is a block diagram of another device that includes an ordinary NVM circuit for storing data such as calibration data to be used by another operational component.

FIG. 1B is a block diagram of device 102B that includes an ordinary NVM circuit for storing data such as calibration data to be used by another operational component.

Device 102B includes NVM circuit 114, operational component 109, and controller 124. Parts of device 102B perform actions that are similar to the actions performed by comparable parts in device 102A of FIG. 1A, while each part may or may not be formed and function similarly as described below.

NVM circuit 114 is an ordinary NVM circuit that is arranged to store data 135, a logic or non-logic value, such as an ON/OFF state, in individual cells (e.g. cell 134) and provide data 135 upon being addressed. In one embodiment, NVM circuit 114 may be an NVM array comprising cells that are addressable in terms of a row and a column.

In some embodiments, a value for data 135 may be encoded in an amount of charge stored in a device. In another embodiment, data 135 may be at least one logical bit, such as a 1 or a zero, stored in cell 134. Of course, data 135 may need more than one cell, and so on.

Controller 124 is adapted to program data 135 in cell 134. Controller 124 is also arranged to address cell 134 to provide data 135 to operational component 109. In addition, controller 124 may cooperate with other components, such as operational component 109.

Operational component 109 may be adapted to receive data 135 for processing, calibration, and the like. In FIG. 1B, data 135 is input in operational component 109 directly. In other embodiments, data 135 may be routed through any suitable component before being input in operational component 109. For example, data 135 may be first input from cell 134 into a binary output circuit. Then, from the binary output circuit, data 135 may be input in operational component 109.

Furthermore, controller 124 may be adapted to sense a performance of operational component 109. Controller 109 may then determine data 135 so as to adjust the performance. The performance may be optimized, if needed. In some instances, adjusting can be to diminish the performance if, for example, more privacy is required.

This feature of determining what data 135 to program may be invoked spontaneously, autonomously, in response to a received command, and so on. Adjusting may be desired if the performance has changed, for example either due to the passage of time, or due to changed environmental conditions, and so on. Adjusting may also take place while manufacturing or testing a device, or preparing it for field use. For example, the processor may step through a number of values to adjust an antenna reception of an RFID tag.

Device 102B may be implemented with fewer or additional components such as support circuitry for NVM circuit 114, communication circuitry for interaction with other devices, and the like.

Figure 1C:
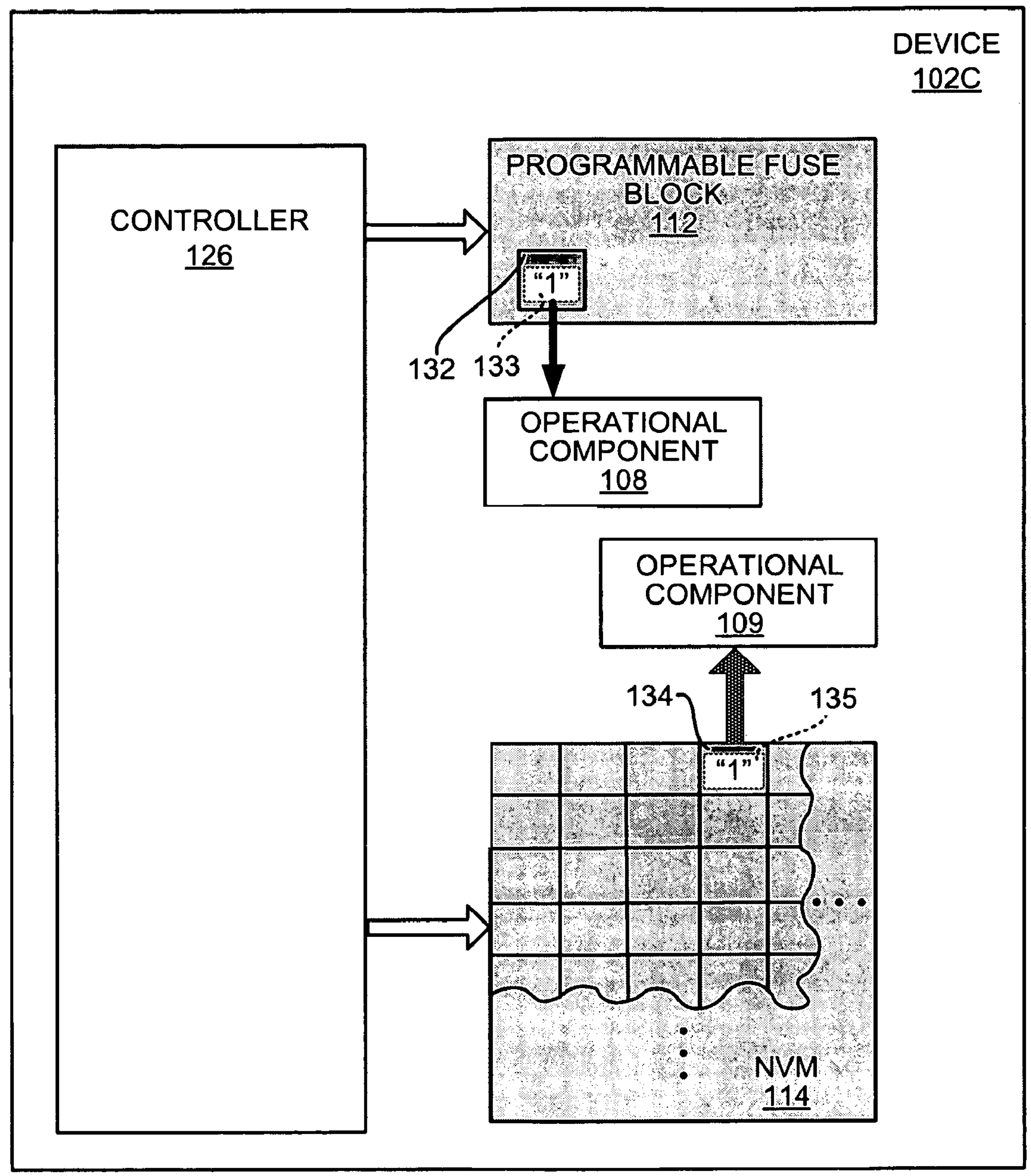
FIG. 1C is a block diagram of a further device that includes a programmable fuse block such as that of FIG. 1A, and an ordinary NVM circuit such as that of FIG. 1B for storing data to be used by different operational components.

FIG. 1C is a block diagram of device 102C that includes a programmable fuse block such as that of FIG. 1A, and an ordinary NVM circuit such as that of FIG. 1B for storing data to be used by different operational components.

Parts of device 102C that are similarly numbered in FIGS. 1A and 1B perform actions that are similar to the actions performed by comparable parts in devices 102A and 102B.

Accordingly, programmable fuse block 112 is adapted to provide a fast calibration data (e.g. data 133) to operational component 108, while NVM circuit 114 is adapted to provide data 135 to operational component 109 for programming purposes, and the like, upon being addressed.

Controller 126 may be a combination of controllers 122 and 124 of FIGS. 1A and 1B, and manage programmable fuse block 112 and NVM circuit 114. Consequently, controller 126 may include different blocks to address, program, monitor, and the like, programmable fuse block 112 and NVM circuit 114.

Some applications may need multiple NVM memory circuits. For example, RFID tags may include components that need calibration data at power-on and other components that need programming data after power-on. In such applications, having separate controller sub-circuits for different types of memory circuits is likely to increase power consumption and size of circuitry. On the other hand, in applications like RFID tags available power and size are at a premium.

Figure 2:
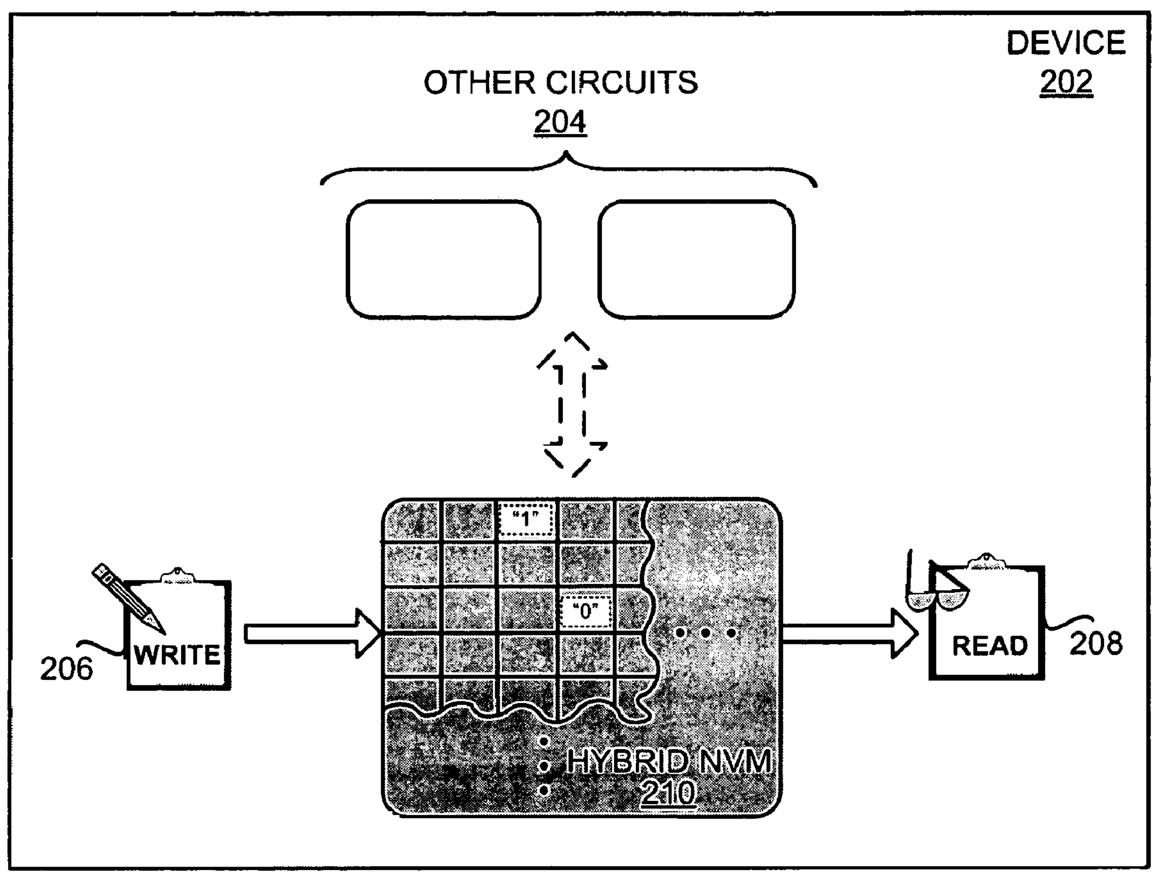
FIG. 2 is a block diagram of a device having a hybrid Non-Volatile Memory (NVM) circuit according to embodiments, for storing data to be used by other components of the device.

FIG. 2 is a block diagram of device 202 having a hybrid Non-Volatile Memory (NVM) circuit according to embodiments, for storing data to be used by other components of the device.

Device 202 includes hybrid NVM circuit 210 that is adapted to interact with other circuits 204. Individual cells of hybrid NVM 210 are adapted to store information as a result of “write” operation 206 and provide the stored information as a result of “read” operation 208. The information is stored even during a power-off state of device 202.

“Read” operation 208, which provides the stored information to one or more of the other circuits 204, may occur during a transition from the power-off state to a power-on state for some parts of hybrid NVM circuit 210. For other parts of hybrid NVM circuit 210, “read” operation 208 may occur during the power-on state upon being addressed by another circuit (e.g. a controller).

As a result, different circuits of device 202 may receive data for their operation at different states of powering the device. For example, an oscillator circuit may be provided calibration data during the transition from the power-off state from one part of hybrid NVM circuit 210, while a digital signal processor circuit may be provided programming data after the transition.

The information stored in hybrid NVM circuit 210 may include analog, digital or other types of data. For example, different parts of hybrid NVM circuit 210 may provide logic bits, ON/OFF states, latched outputs for trimming analog circuits, and the like.

Figure 3:
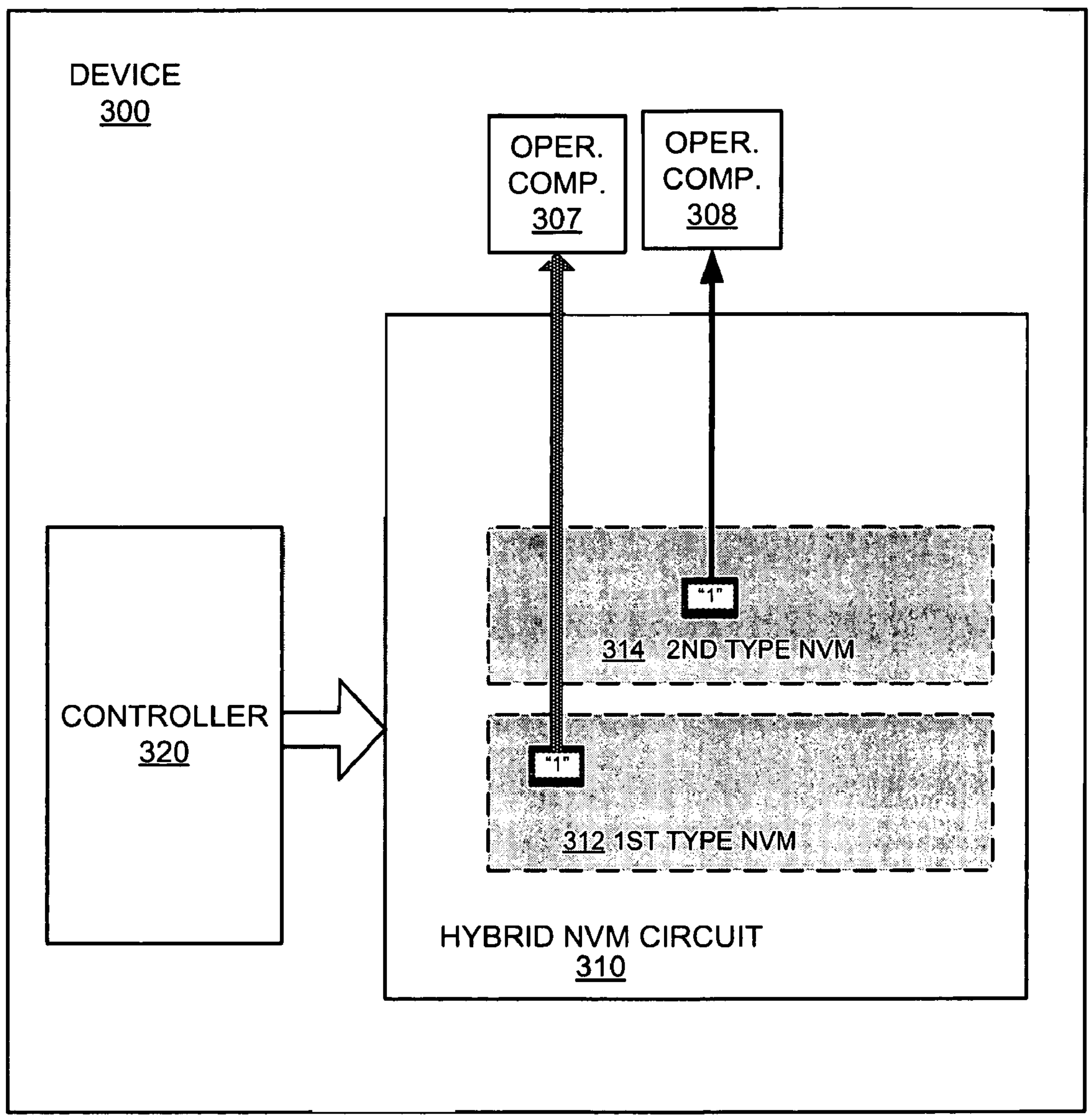
FIG. 3 is a block diagram of a device having a particular embodiment of the hybrid NVM circuit of FIG. 2 that accommodates two different types of NVM subcircuits, for storing data to be used by other components of the device.

FIG. 3 is a block diagram of device 300 having a particular embodiment of the hybrid NVM circuit 210 of FIG. 2 that accommodates two different types of NVM sub-circuits, for storing data to be used by other components of the device.

Hybrid NVM circuit 310 includes first type NVM sub-circuit 312 and second type NVM sub-circuit 314. First type NVM sub-circuit 312 and second type NVM sub-circuit 314 operate as described previously and provide input to operational components 307 and 308, respectively. In one example embodiment, first type NVM sub-circuit 312 may provide a fast output for calibrating operational component 307 during a transition to the power-on state. In another example embodiment, second type NVM sub-circuit 314 may provide programming data to operational component 308 in the power-on state upon being addressed by controller 320.

Controller 320 is adapted to interact with both NVM sub-circuits. The interaction may include programming the NVM sub-circuits, addressing individual cells to output their data, and the like. In one embodiment, hybrid NVM circuit 310 may also include a sub-circuit that is adapted to store one or more fixed bits. In such an embodiment, controller 320 may include a by-passing circuit that arranged to by-pass the one or more fixed bits. Such a by-passing circuit may also include at least one programmable bit.

By integrating first type NVM sub-circuit 312 and second type NVM sub-circuit 314, and combining the control operations in a single controller (320), size and power consumption can be optimized.

Figure 4:
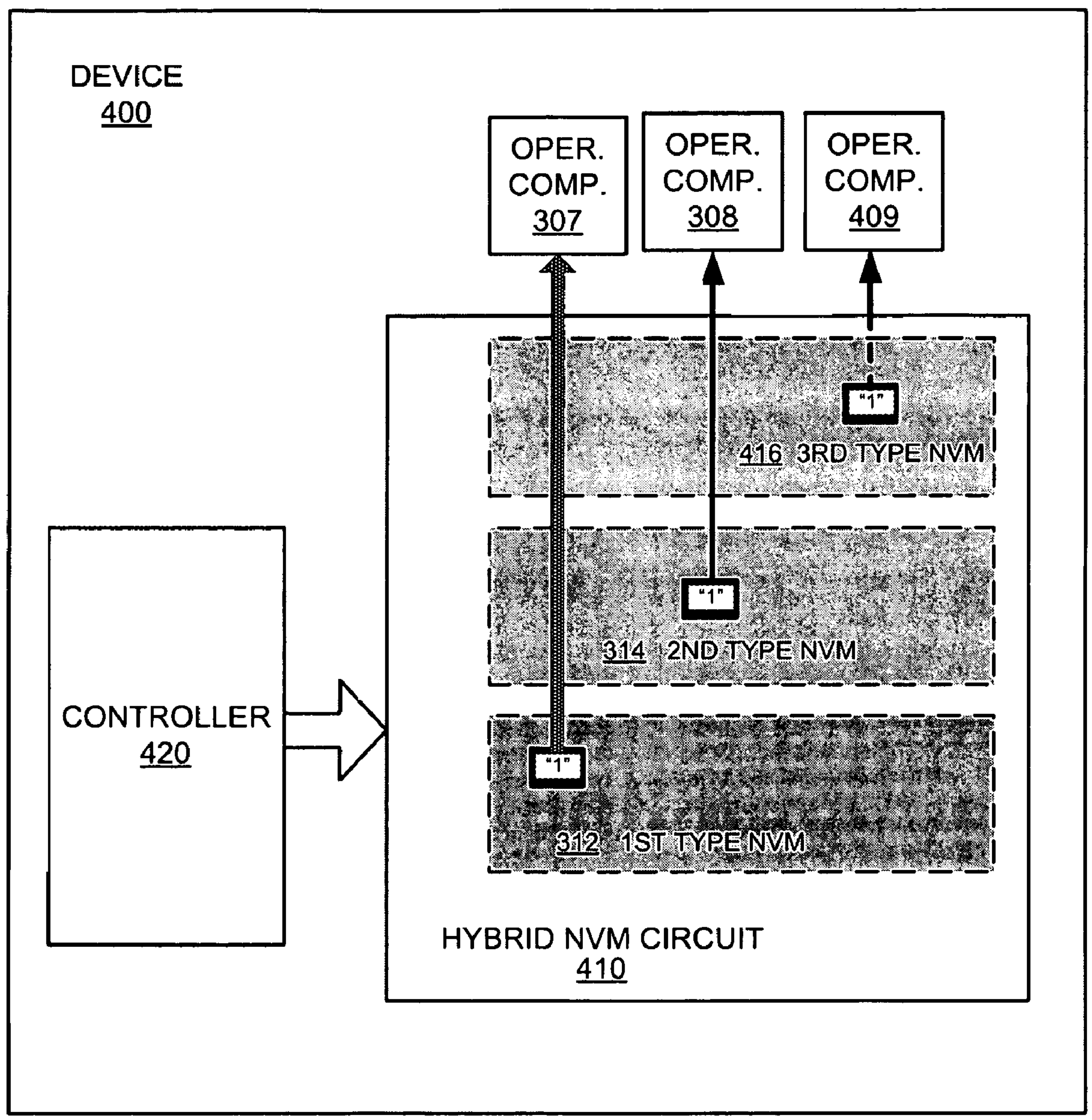
FIG. 4 is a block diagram of a device having a particular embodiment of the hybrid NVM circuit of FIG. 2 that accommodates three different types of NVM subcircuits, for storing data to be used by other components of the device.

FIG. 4 is a block diagram of device 400 having a particular embodiment of the hybrid NVM circuit 210 of FIG. 2 that accommodates three different types of NVM subcircuits, for storing data to be used by other components of the device.

Parts of device 400 that are similarly numbered in device 300 of FIG. 3 operate in a likewise manner. To illustrate the diversity of the hybrid NVM concept, hybrid NVM circuit 410 includes three NVM sub-circuits: first type NVM sub-circuit 312, second type NVM sub-circuit 314, third type NVM sub-circuit 416.

In addition to the first and second type NVM sub-circuits, third type NVM sub-circuit 416 provides input to operational component 409. In one embodiment, third type NVM sub-circuit 416 may provide a latched output for trimming an analog circuit. In a further embodiment, third type NVM sub-circuit 416 may provide an ON/OFF state output that may be employed to control at least one of a voltage, a frequency, or a current.

Figure 5A:
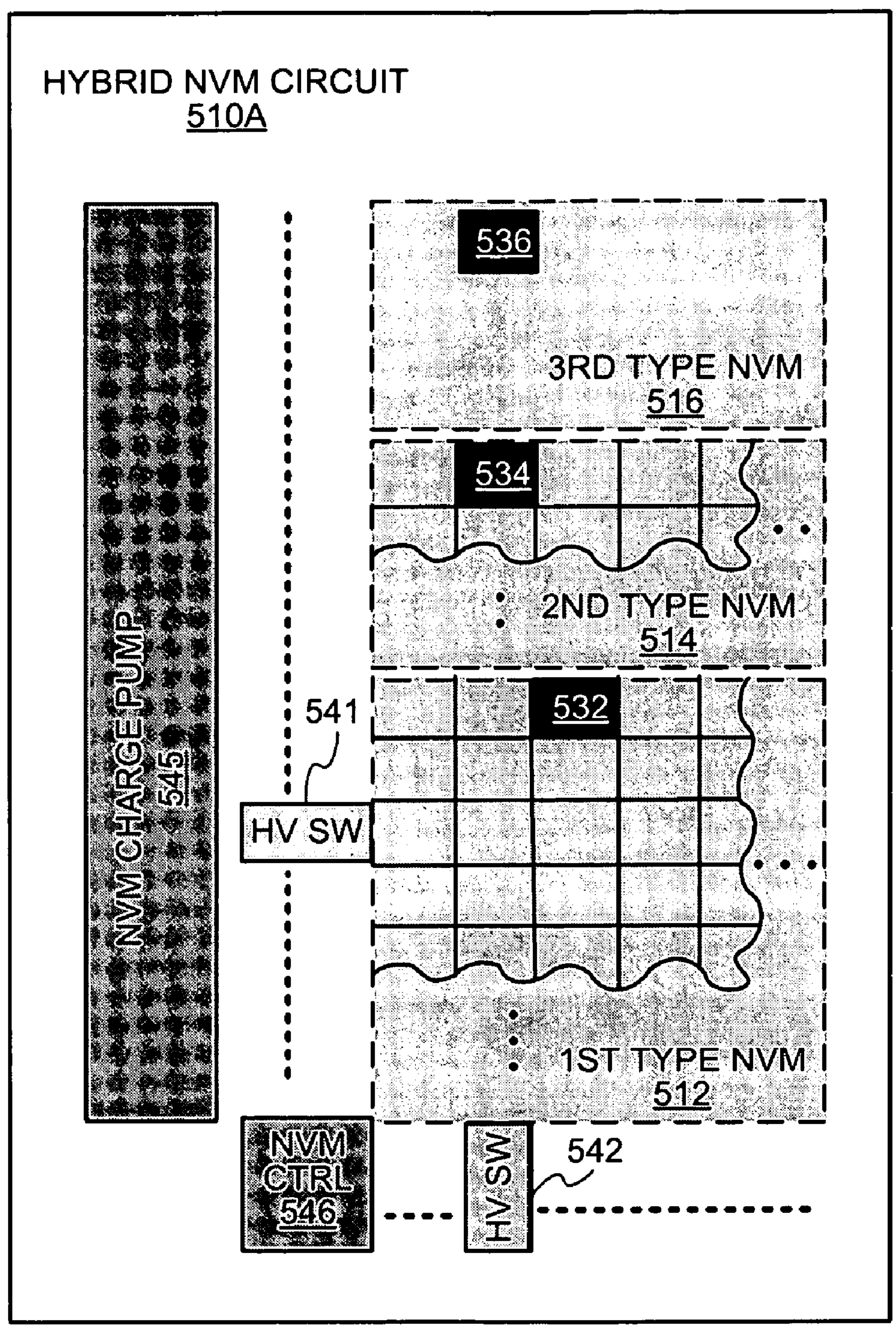
FIG. 5A is a block diagram illustrating an implementation of the hybrid NVM circuit of FIG. 4 according to an embodiment.

FIG. 5A is a block diagram illustrating an implementation of hybrid NVM circuit 510A according to an embodiment.

Hybrid NVM circuit 510A includes first type NVM sub-circuit 512, second type NVM sub-circuit 514, and third type NVM sub-circuit 516. These NVM sub-circuits are examples of NVM circuits as described in conjunction with previous figures.

NVM sub-circuits commonly comprise a number of cells (e.g. cells 532, 534, and 536), which store the data to be consumed by operational components. NVM sub-circuits may be implemented in form of an NVM array comprising cells that are addressable in terms of a row and a column. First type NVM sub-circuit 512 and second type NVM sub-circuit 514 are examples of NVM arrays, while third type NVM sub-circuit 516 illustrates a non-array NVM circuit.

In some embodiments, a non-volatile memory cell may be constructed using a floating-gate pFET readout transistor having its source tied to a power source and its drain providing a current, which can be sensed to determine the state of the cell. The gate of the pFET readout transistor provides for charge storage, which can be used to represent information such as binary bits. A control capacitor structure having its first terminal coupled to a first voltage source and its second terminal coupled to the floating gate and a tunneling capacitor structure having its first terminal coupled to a second voltage source and its second terminal coupled to the floating gate may be utilized in each embodiment.

The control capacitor structure is fabricated so that it has much more capacitance than does the tunneling capacitor structure (and assorted stray capacitance between the floating gate and various other nodes of the cell). Manipulation of the voltages applied to the first voltage source and second voltage source controls an electric field across the capacitor structure and pFET dielectrics and thus Fowler-Nordheim tunneling of electrons onto and off of the floating gate, thus controlling the charge on the floating gate and the information value stored thereon.

High voltage switches 541 and 542 are examples of a series of high voltage switches that are arranged to provide the first and the second voltages for programming and erasing of the NVM cells.

NVM controller 546 is arranged to program and address individual cells of the NVM sub-circuits to output their data by managing high voltage switches 541, 542, and the like.

NVM charge pump 545 is an electronic circuit that uses capacitors as energy storage elements to convert low voltages into higher voltage outputs. Charge pump circuits are typically capable of high efficiencies, sometimes as high as 90-95%.

NVM charge pump 545 may use switches to control a connection of voltages to the capacitor. For example, to generate a higher voltage, a first stage may involve the capacitor being connected across a voltage and charged up. In a second stage, the capacitor is disconnected from the original charging voltage and reconnected with its negative terminal to the original positive charging voltage. Because the capacitor retains the voltage across it (ignoring leakage effects) the positive terminal voltage is added to the original, effectively doubling the voltage. This higher voltage output may then be smoothed by the use of another capacitor.

Figure 5B:
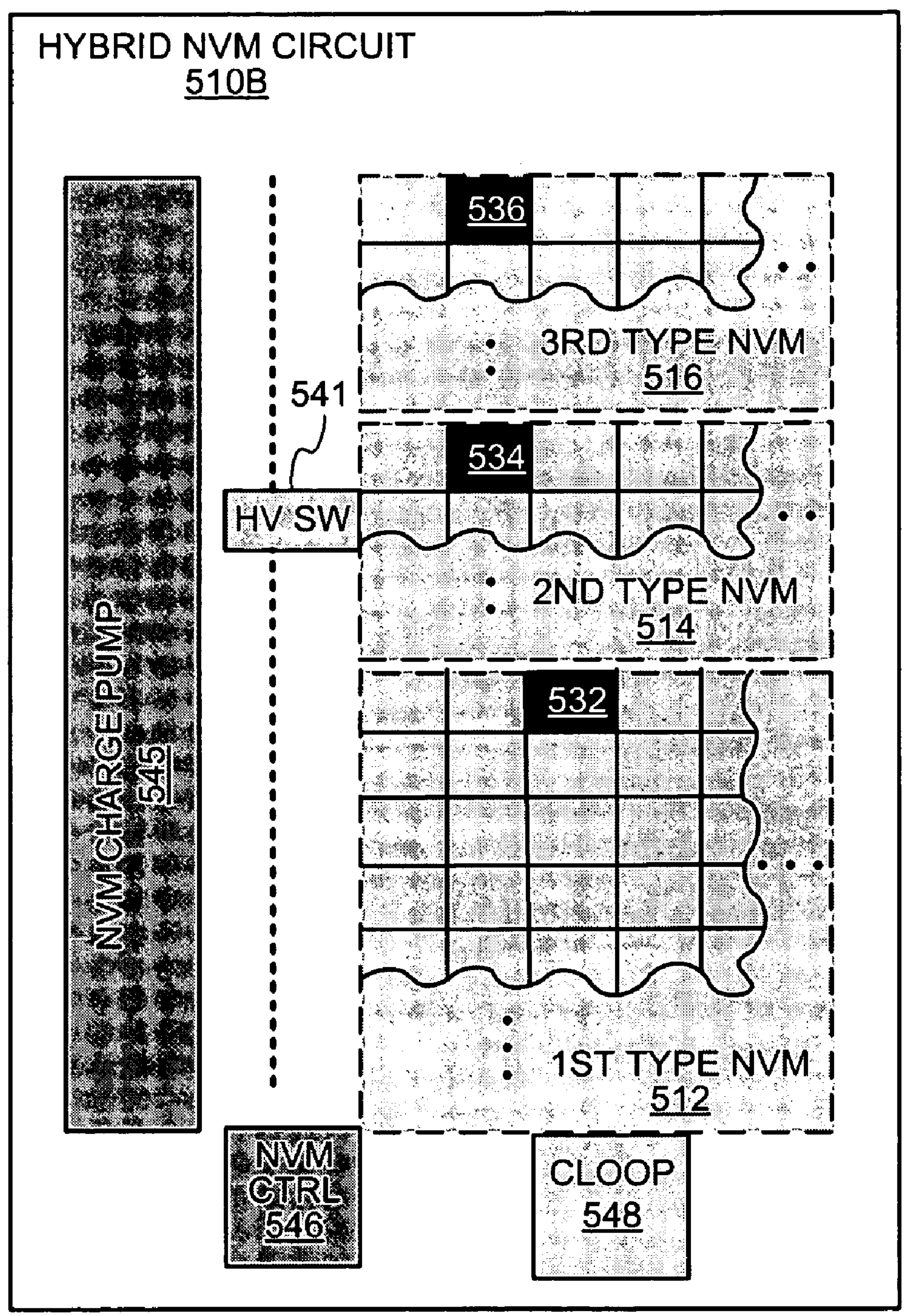
FIG. 5B is a block diagram illustrating an implementation of the hybrid NVM circuit of FIG. 4 according to another embodiment.

FIG. 5B is a block diagram illustrating an implementation of hybrid NVM circuit 510B according to another embodiment. Parts of hybrid NVM circuit 510B that are similarly numbered in hybrid NVM circuit 510A of FIG. 5A operate in a likewise manner.

To emphasize that NVM sub-circuits may or may not include arrays, all three NVM sub-circuits in hybrid NVM circuit 510B are illustrated in array form. Differently from FIG. 5A, hybrid NVM circuit 510B includes CLOOP 548 in place of high voltage switch 542.

In some embodiments, a Control Loop for Overtunneling Current Prevention (CLOOP) device may be implemented instead of a series of high voltage switches that control rows and columns of NVM arrays within the hybrid NVM circuit. CLOOP 548 is such a device. Structure and operation of a CLOOP device is described in detail in U.S. Pat. No. 6,853,583.

The examples of FIGS. 5A and 5B are for illustration purposes, and do not constitute a limitation on the present invention. Other embodiments may be implemented using other circuits and other combinations of circuits for providing common support circuitry to a plurality of NVM sub-circuits of a hybrid NVM circuit, without departing from the scope and spirit of the invention. For example, the hybrid NVM circuit may further include an oscillator, an ESD protection device, and the like.

Figure 6:
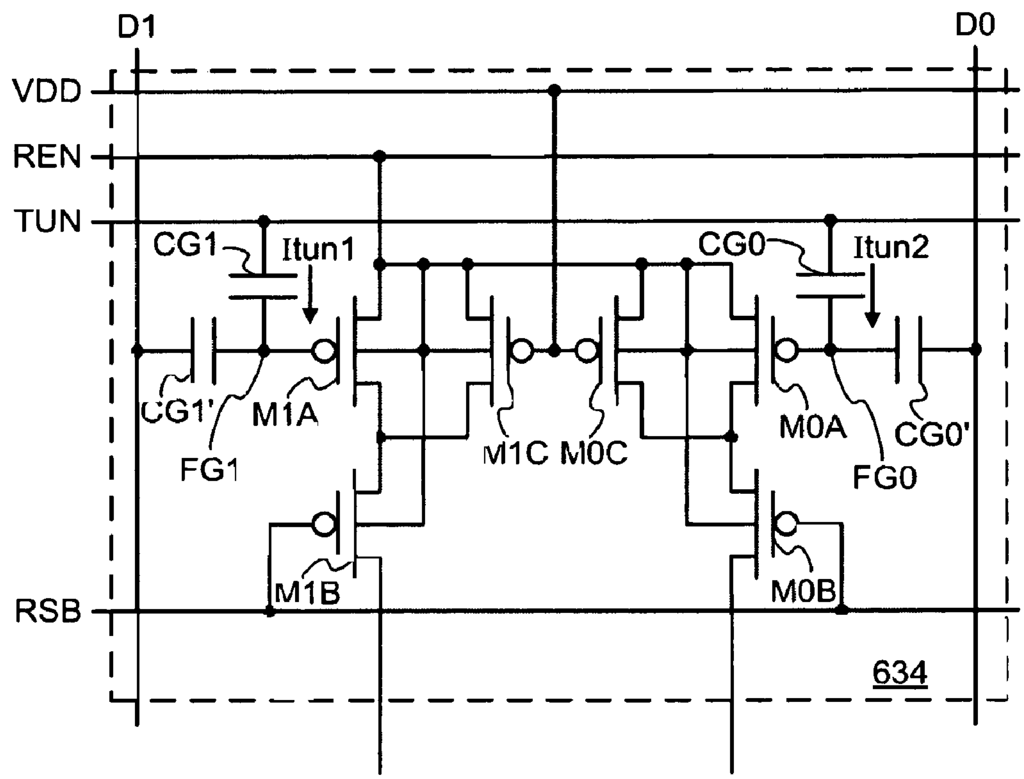
FIG. 6 schematically illustrates an embodiment of an ordinary type of NVM cell that may be part of the hybrid NVM circuit of FIG. 3 or FIG. 4.

FIG. 6 schematically illustrates an embodiment of an ordinary type of NVM cell (634) that may be part of the hybrid NVM circuit of FIG. 3 or FIG. 4.

NVM cell 634 is adapted to store and provide a logic value such as a "1" or a "0" bit. While FIG. 6 shows an example implementation, an "ordinary" NVM cell may be implemented in any way known in the art.

Schematic diagram of NVM cell 634 shows the tunneling transistors as capacitors denoted CG1 and CG0 and the control transistors as capacitors denoted CG1' and CG0' for clarity but they may be implemented with pFETs, for example as described in U.S. patent application Ser. No. 11/839,935 filed on May 5, 2004.

In this embodiment, VDD may be provided at all times to bias the gates of transistors MI C and MOC. REN (row enable) and RSB (row select bar) are provided to address individual cells such as NVM cell 634 in the NVM array. TUN is tunneling signal provided to tunneling capacitors CG1 and CG0. The signals VDD, REN, TUN and RSB are the row control signals, although VDD need not be applied via a row and could instead be applied via a column. The column control signals comprise the data signals on lines D1 and D0.

Transistors M1C and M0C have their gates coupled together and to VDD and their sources, drains and well connections coupled to the corresponding sources, drains and well connections of respective readout transistors M1A and M0A. This is done in order to avoid disturbing the contents of the cell when it is not selected.

During a read operation, the REN (row enable) line is set to VDD and with the gates of M1C and M0C at VDD. Thus, M1C and M0C are not conducting and readout transistors M1A and M0A operate normally to provide an output current as a function of charge stored on corresponding floating gates FG1 and FG0.

During a write operation, REN is set to approximately half the tunneling voltage. With VDD on the gates of M1C and M0C, M1C and M0C conduct, effectively connecting the drain nodes of M1A and M0A to REN. Since the drain, source, and bulk nodes of both M1A and M0A are set to half the tunneling voltage, there can be no tunneling across M1A or M0A. Furthermore, TUN is also set to half the tunneling voltage during the write mode. Accordingly, there can be no tunneling across CG1 or CG0.

Figure 7:
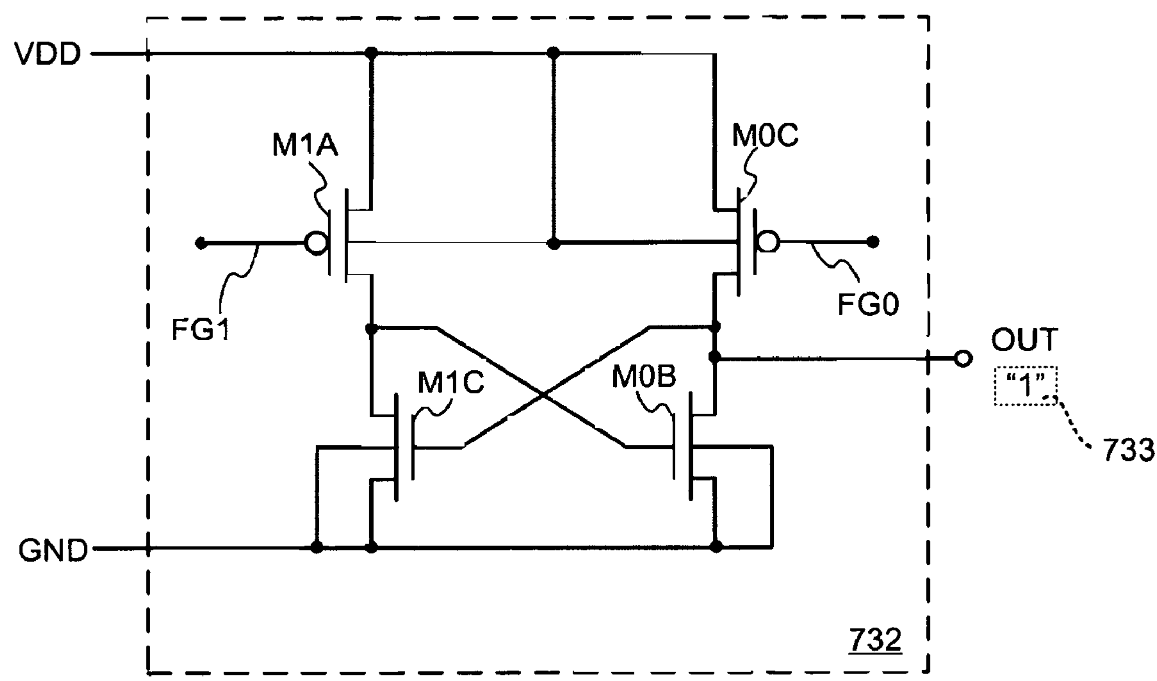
FIG. 7 schematically illustrates an embodiment of another type of NVM cell that may be part of the hybrid NVM circuit of FIG. 3 or FIG. 4.

FIG. 7 schematically illustrates an embodiment of another type of NVM cell (732) that may be part of the hybrid NVM circuit of FIG. 3 or FIG. 4.

NVM cell 732 is one embodiment of a programmable fuse implemented using Metal Oxide Field Effect Transistors (MOSFETs). NVM cell 732 comprises cross-coupled transistor pair M1C and M0B, which form a half latch circuit. In the MOSFET embodiment, M1C and M0B may be nFETs. A gate terminal of M1C is coupled to a drain of M0B. Similarly, a gate terminal of M0B is coupled to a drain of M1C. Sources of both transistors are coupled together and are arranged to receive a ground signal.

The drain terminal of M0B is arranged to provide output signal OUT, which includes stored value 733. In one embodiment, stored value 733 may be a digital value “0” or “1”.

Drain terminals of pFET type transistors M1A and M0C are coupled to drain terminals of M1C and M0B, respectively. Source terminals of M1A and M0C are coupled to a supply voltage (VDD). The source terminals are also arranged to receive a reset signal or a power-on reset (POR) signal.

Gate terminals of M1A and M0C (FG1 and FG0) are arranged as floating gates that store a charge such that NVM cell 732 settles on a state determined by the charges of the floating gates upon receiving a power-up signal (VDD applied) or the reset signal.

Whereas MC1 and M0B form a half latch circuit, programmable fuses may be implemented using full latch circuits, multiple pairs of half latch circuits, and the like. Furthermore, the transistors are not restricted to MOSFET type transistors, and other types devices may also be employed.

The programmable fuse forming NVM cell 732 is termed “self-latching”, meaning that once power is applied to the fuse, the latch of the associated fuse will eventually settle to some state. Details of programmable fuses are described in more detail in U.S. patent application Ser. No. 10/813,907 filed on Mar. 30, 2004; Ser. No. 10/814,866 filed on Mar. 30, 2004; and Ser. No. 10/814,868 filed on Mar. 30, 2004.

Figure 8:
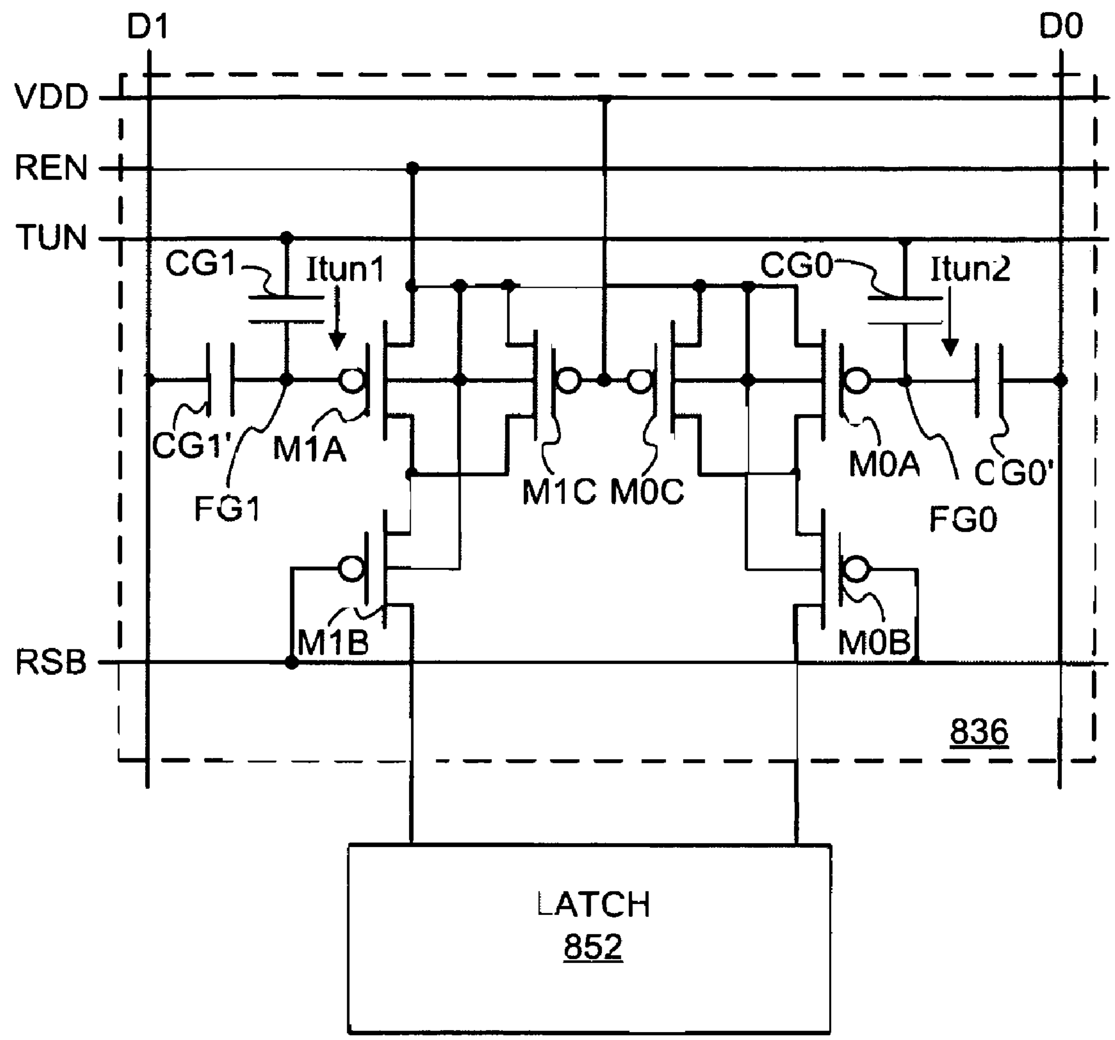
FIG. 8 schematically illustrates an embodiment of yet another type of an NVM cell that may be part of the hybrid NVM circuit of FIG. 3 or FIG. 4.

FIG. 8 schematically illustrates an embodiment of yet another type of an NVM cell (836) that may be part of the hybrid NVM circuit of FIG. 3 or FIG. 4.

Employing latch 852, NVM cell 836 provides a latched output to other operational components. This makes an output of NVM cell 836 suitable for trimming analog circuits. Parts of NVM cell 836 that are similarly numbered in NVM cell 634 of FIG. 6 operate in a likewise manner.

In addition to the components of NVM cell 634 of FIG. 6, NVM cell 836 includes latch 852, which is coupled to drains of M1B and M0B. Sources of M1B and M0B are coupled to drains of M1C-M1A and M0C-M0A transistor pairs. RSB signal controls gate terminals of M1B and M0B providing an output to latch 852.

Latch 852 is arranged to settle on a state upon receiving the output of NVM cell 634 such that the stored output can be used to trim an analog circuit, and the like.

Figure 9:
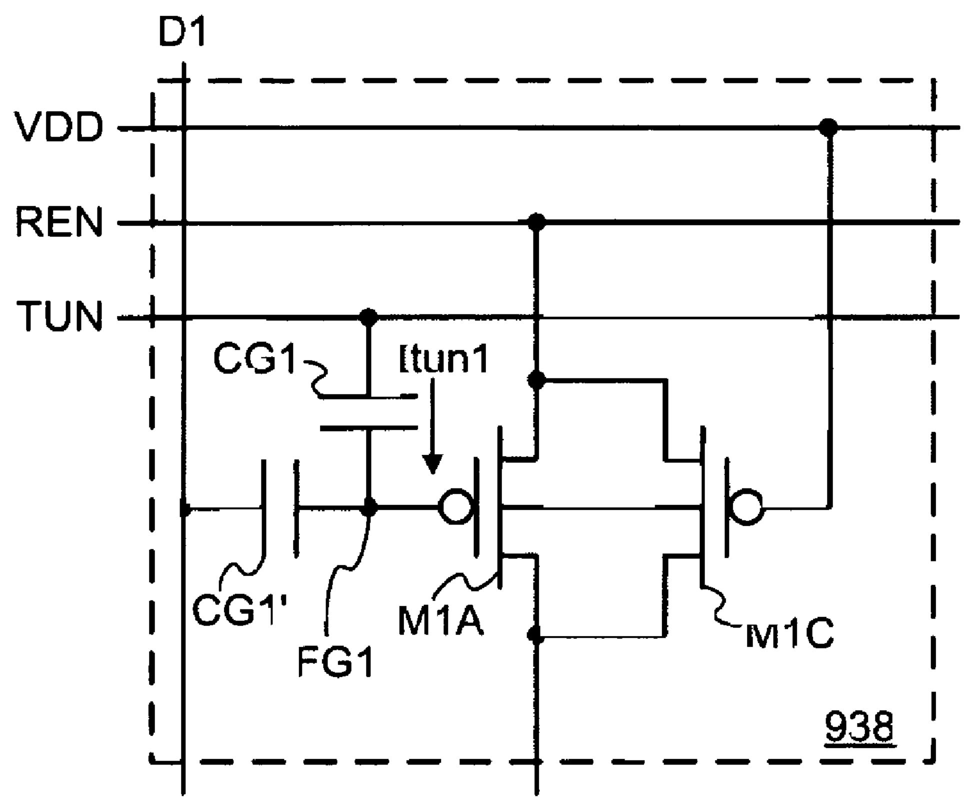
FIG. 9 schematically illustrates an embodiment of one more type of an NVM cell that may be part of the hybrid NVM circuit of FIG. 3 or FIG. 4.

FIG. 9 schematically illustrates an embodiment of one more type of an NVM cell (938) that may be part of the hybrid NVM circuit of FIG. 3 or FIG. 4.

NVM cell 938 includes transistors M1A and M1C, which are coupled together at their source and drain terminals. The source terminals are arranged to receive REN signal, while the drain terminals are arranged to provide an output.

A gate terminal of M1C is arranged to receive supply voltage VDD. A tunneling transistor as capacitor denoted CG1 and a control transistor as capacitor denoted CG1' are coupled to a gate terminal of M1A, and function as described above in conjunction with FIG. 6.

An output of NVM cell 938 may be an ON state of an OFF state. The output may be used to control a current, a voltage, or a frequency of an operational component.

In this description, numerous details have been set forth in order to provide a thorough understanding. In other instances, well-known features have not been described in detail in order to not obscure unnecessarily the description.

A person skilled in the art will be able to practice the present invention in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A hybrid Non-Volatile Memory (NVM) device, comprising:

a first circuit of at least one of first type NVM cell;

a second circuit of at least one of second type NVM cell that is different from the first type NVM cell;

support circuitry, wherein a portion of the support circuitry is arranged to support the first circuit and the second circuit, wherein one of the first circuit and the second circuit is arranged to provide an output upon transitioning to a power-on state; and wherein another of the first circuit and the second circuit is arranged to provide an output upon being addressed.

2. The NVM device of claim 1, wherein the first circuit is arranged to provide an output faster than an output of the second circuit.

3. The NVM device of claim 1, wherein one of the first circuit and the second circuit is arranged in an array configuration; and wherein another of the first circuit and the second circuit is arranged in a non-array configuration.

4. The NVM device of claim 1, further comprising:

at least one additional type NVM circuit, wherein the portion of the support circuitry is arranged to support also the at least one additional type NVM circuit.

5. The NVM device of claim 1, wherein the first circuit is a programmable fuse circuit.

6. The NVM device of claim 5, wherein the programmable fuse circuit includes at least one of: a one time programmable (OTP) fuse cell and a multiple time programmable (MTP) fuse cell.

7. The NVM device of claim 5, wherein the programmable fuse circuit is programmable for storing its logic value.

8. The NVM device of claim 5, wherein the programmable fuse circuit is adapted to output its stored logic value upon receiving a Power On Reset (POR) signal.

9. The NVM device of claim 1, wherein the second circuit is an ordinary NVM circuit that is arranged to provide a logic value to an operational component.

10. A hybrid Non-Volatile Memory (NVM) device, comprising:

a first circuit of at least one of first type NVM cell;

a second circuit of at least one of second type NVM cell that is different from the first type NVM cell, wherein the second circuit is an ordinary NVM circuit that is arranged to provide a logic value to an operational component, and wherein the second circuit includes at least one NVM cell that is arranged to provide an output for trimming an analog operational component; and support circuitry, wherein a portion of the support circuitry is arranged to support the first circuit and the second circuit.

11. The NVM device of claim 10, further comprising:

a latch to store the logic value outputted from the NVM cell.

12. The NVM device of claim 10, wherein the second circuit is arranged to provide one of: an ON state and an OFF state to the operational component.

13. The NVM device of claim 12, wherein the second circuit includes a transistor switch circuit that is arranged to control one of: a voltage, a current, and a frequency.

14. The NVM device of claim 10, wherein the support circuitry include at least one of a charge pump circuit, a controller circuit, and a plurality of high voltage switch circuits.

15. The NVM device of claim 14, wherein the support circuitry further include a control loop for overtunneling prevention (CLOOP) circuit.

16. The NVM device of claim 14, wherein the controller circuit is adapted to program at least one of: the first circuit and the second circuit.

17. The NVM device of claim 14, wherein the controller circuit is further adapted to:

evaluate a performance of the operational component associated with the NVM device; and determine a value to be programmed in at least one of: the first circuit and the second circuit for improving the performance of the operational component.

18. The NVM device of claim 10, wherein the second circuit comprises NVM cells that are arranged in row and column bits of an NVM array and at least one NVM cell is adapted to output its stored logic value upon being addressed according to its row and column.

19. The NVM device of claim 10, wherein cells of at least one of the first circuit and the second circuit are arranged to be programmed by one of: tunneling and hot electron injection.

20. A hybrid Non-Volatile Memory (NVM) device, comprising:

a first circuit that includes a plurality of NVM array bits arranged in rows and columns of an NVM array, wherein a first portion of the NVM array bits are arranged to output their stored logic value faster than a second portion of the NVM array bits during a power-on state;

a second circuit that includes at least one NVM cell arranged to provide an output upon transitioning to a power-on state; and support circuitry, wherein a portion of the support circuitry is shared by the first circuit and the second circuit, wherein the support circuitry include an addressing circuit that is arranged to cause the second portion of NVM array bits to output their stored logic value in the power-on state; and wherein the support circuitry include a charge pump circuit and one of: a plurality of high voltage switch circuits and a control loop for overtunneling protection (CLOOP) circuit.

21. The NVM device of claim 20, wherein the first portion of the NVM array bits is arranged similarly to the second portion of the NVM array bits.

22. The NVM device of claim 20, wherein the first portion of the NVM array bits includes at least one of a programmable bit and a fixed bit.

23. The NVM device of claim 20, wherein the first portion of the NVM array bits includes at least one of a programmable bit and a fixed bit; and the addressing circuit includes a by-passing circuit that is arranged to by-pass the fixed bit.

24. The NVM device of claim 23, wherein the by-passing circuit includes at least one programmable bit.

25. A hybrid Non-Volatile Memory (NVM) device, comprising:

a first circuit that includes a plurality of NVM array bits arranged in rows and columns of an NVM array, wherein a first portion of the NVM array bits are arranged to output their stored logic value faster than a second portion of the NVM array bits during a power-on state;

a second circuit that includes at least one NVM cell arranged to provide an output upon transitioning to a power-on state;

support circuitry, wherein a portion of the support circuitry is shared by the first circuit and the second circuit, wherein the support circuitry include an addressing circuit that is arranged to cause the second portion of the NVM array bits to output their stored logic value in the power-on state; and a third portion of NVM array bits that is arranged to provide an output for trimming an analog operational component.

26. The NVM device of claim 25, further comprising:

a fourth portion of NVM array bits that is arranged to provide one of an ON state and an OFF state to at least one of the first and the second operational component.

27. A method for a hybrid Non-Volatile Memory (NVM) device, comprising:

storing a plurality of values in a plurality of NVM cells, wherein the NVM cells are adapted to store the values even during a power-off state;

outputting a first portion of NVM cells upon powering support circuitry;

outputting a second portion of NVM cells upon being addressed by the support circuitry, wherein the support circuitry is shared by the first portion of NVM cells and the second portion of NVM cells; and trimming an analog operational component responsive to an output of the second portion of NVM array cells.

28. The method of claim 27, further comprising:

outputting the second portion of NVM cells as a result of a stored value in at least one of the first portion of NVM cells.

29. The method of claim 27, wherein the first portion of NVM cells includes at least one of: a one time programmable (OTP) fuse cell and a multiple time programmable (MTP) fuse cell.

30. The method of claim 27, further comprising:

programming the first portion of NVM cells for storing their logic value.

31. The method of claim 27, further comprising:

evaluating a performance of an operational component; and determining a value to be programmed in the first portion of NVM cells for improving the performance.

32. The method of claim 27, wherein the second portion of the NVM cells are NVM bits of an NVM array, and the NVM bits are outputted as a result addressing of rows and columns of the NVM array by a control circuit.

33. The method of claim 27, wherein the second portion of NVM bits includes at least one of a programmable bit and a fixed bit.

* * * * *

UNITED STATES PATENT AND TRADEMARK OFFICE

CERTIFICATE OF CORRECTION

PATENT NO. : 7,283,390 B2
APPLICATION NO. : 11/237099
DATED : October 16, 2007
INVENTOR(S) : Pesavento It is certified that error appears in the above-identified patent and that said Letters Patent is hereby corrected as shown below:

In column 1, line 13, delete “application” and insert -- applications --, therefor.

In column 9, line 4, delete “MI C and MOC.” and insert -- M1C and M0C. --, therefor.

In column 11, line 3, in Claim 1, after “state” delete “;” and insert -- , --, therefor.

Signed and Sealed this

Eighth Day of April, 2008

JON W. DUDAS
*Director of the United States Patent and Trademark Office*

UNITED STATES PATENT AND TRADEMARK OFFICE

CERTIFICATE OF CORRECTION

PATENT NO. : 7,283,390 B2
APPLICATION NO. : 11/237099
DATED : October 16, 2007
INVENTOR(S) : Alberto Pesavento It is certified that error appears in the above-identified patent and that said Letters Patent is hereby corrected as shown below:

1. On the Title Page Item (63) the heading "Related U.S. Application Data," replace the existing paragraph in its entirety with the following:

--Continuation-in-part of application No. 11/016,546, filed on Dec. 17, 2004, and a continuation-in-part of application No. 11/015,293, filed on Dec. 17, 2004, and a continuation-in-part of application No. 10/839,985, filed on May 5, 2004, now Pat. No. 7,221,596, and a continuation-in-part of application No. 10/830,280, filed on Apr. 21, 2004, now Pat. No. 7,212,446.--

2. On Column 1, Lines 5-11, replace the existing paragraph in its entirety with the following:

--This utility patent application is a continuation-in-part (CIP) of U.S. patent application Ser. No. 10/830,280 filed on Apr. 21, 2004 now U.S. Pat. No. 7,212,446; Ser. No. 10/839,985 filed on May 5, 2004; Ser. No. 11/016,546 filed on Dec. 17, 2004; and Ser. No. 11/015,293 filed on Dec. 17, 2004. The benefit of the earlier filing date of the parent applications is hereby claimed under 35 U.S.C. § 120.--

Signed and Sealed this
Twenty-second Day of February, 2011

David J. Kappos
*Director of the United States Patent and Trademark Office*